United States Patent [19]

Arai et al.

[11] Patent Number: 4,844,949
[45] Date of Patent: Jul. 4, 1989

[54] METHOD OF SURFACE TREATMENT AND APPARATUS USED THEREFOR

[75] Inventors: Tohru Arai; Junji Endo; Hiromasa Takeda, all of Aichi, Japan

[73] Assignee: Kabushiki Kaisha Toyota Chuo Kenkyusho, Aichi, Japan

[21] Appl. No.: 249,251

[22] Filed: Sep. 23, 1988

Related U.S. Application Data

[63] Continuation of Ser. No. 68,129, Jun. 30, 1987, abandoned.

[30] Foreign Application Priority Data

Jul. 7, 1986 [JP] Japan ............................. 61-159440

[51] Int. Cl.$^4$ ............................................. C23C 16/00
[52] U.S. Cl. .................................. 427/213; 118/717; 118/429; 118/DIG. 5; 427/249; 427/255.2; 427/255.4; 148/278; 148/240
[58] Field of Search ................ 118/429, 717, DIG. 5; 427/213, 249, 255.2, 255.4; 148/6, 6.35

[56] References Cited

U.S. PATENT DOCUMENTS

| | | | |
|---|---|---|---|
| 3,579,373 | 5/1971 | Pingel | 427/249 |
| 4,569,862 | 2/1986 | Arai et al. | 427/249 |
| 4,585,673 | 4/1986 | Sigai | 427/213 |
| 4,623,400 | 11/1986 | Japka et al. | 427/249 |
| 4,637,837 | 1/1987 | Von Matuschka et al. | 427/255.4 |
| 4,686,117 | 8/1987 | Arai et al. | 427/249 |

FOREIGN PATENT DOCUMENTS 59-107990 6/1984 Japan ............................. 427/249

Primary Examiner—Shrive Beck
Attorney, Agent, or Firm—Berman, Aisenberg & Platt

[57] ABSTRACT

A method of forming a surface layer of carbide, nitride, carbonitride, or solid-solution on the surface of a material to be treated, which comprises disposing in a fluidized bed furnace a treating agent comprising a powder of a refractory material, and a powder of a metal for forming a carbide, nitride, carbonitride or solid-solution or a powder of an alloy thereof, introducing a fluidizing gas into the fluidized bed furnace to fluidize the treating agent and form a fluidized layer, disposing the material to be treated in the fluidized layer, and introducing a predetermined amount of halide into the fluidized layer, and an apparatus for forming the surface layer on the material to be treated, comprising a furnace body for forming the surface layer in the fluidized layer of the treating agent, a heating furnace for heating the fluidized layer, a halide supply pipe in communication with the outside of the furnace body, and a halide gas jetting pipe disposed within the furnace body, which is connected to the halide supply pipe and has a plurality of apertures opened into the fluidized layer.

15 Claims, 3 Drawing Sheets

METHOD OF SURFACE TREATMENT AND APPARATUS USED THEREFOR

This application is a continuation of Ser. No. 068,129, filed June 30, 1987 and now abandoned. The parent application was directed to subject matter related to that disclosed in Application Ser. No 913,643 (filed Sept. 30, 1986) now Pat. No. 4,686,117 and to that disclosed in Application Ser. No. 66,483 (filed May 29, 1987) and now Pat. No. 4,786,526.

BACKGROUND OF THE INVENTION

1. Field of the Invention

This invention concerns a method of forming a layer of the carbide, nitride and carbonitride of titanium (Ti), vanadium (V), niobium (Nb), tantalum (Ta), chromium (Cr.), manganese (Mn), tungsten (W), molybdenum (Mo), etc., or solid solution of such element and a matrix element on the surface of a material to be treated by using a fluidized bed furnace, as well as an apparatus used for the method.

2. Description of the Prior Art

Technics for forming a carbide or nitride layer on the surface of a material to be treated by using a fluidized bed have been known, for example, in Japanese Patent Application No. Sho 57-213749 (Patent Application Laid-Open No. Sho 59-107990) and Japanese Patent Application No. Sho 59-108054 (Corresponding to U.S. Pat. No. 4,569,862) previously filed by the present applicant.

The method comprises fluidizing a treating agent comprising a mixture of a powder of refractory material, such as alumina (hereinafter referred to as a fludizing agent), a powder of metal or its alloy containing a carbide- or nitride-forming element (hereinafter referred to as a layer-forming agent), and an ammonium halide salt or a metal halide which is sublimable or vaporizable at or below the treating temperature (hereinafter referred to as an activator) by means of a fluidizing gas, such as argon, embedding a material to be treated in a fluidized bed and forming a carbide, nitride or carbonitride at the surface of the material to be treated. The carbide is formed when the gas of the halide of the carbide-forming element evolves, upon reaction of the layer-forming agent and the gas of the activator reacts with carbon in the material to be treated, and the nitride is formed when the gas of the halide of the nitride-forming element generated in the same way reacts with nitrogen in steels or a nitrogen gas introduced into the fluidized bed.

It is necessary for the activator used in this method to be sublimable or vaporizable at or below the treating temperature in order to prevent the solidification of the treating agent during treatment, thereby maintaining the fluidization. Thus, during long-time use of the treating agent, the activator partially escapes to gradually reduce the surface layer-forming performance. Therefore, the thickness of the carbide or the nitride layer formed may possibly be decreased with the elapse of the treating time. As one of the countermeasures for overcoming such a problem, the present inventors have filed PCT/JP Patent Application No. Sho 86/00360 (U.S. Application Ser. No. 66,483) and now U.S. Pat. No. 4,786,526. Specifically, in this prior application, a powder mixture of a layer-forming agent and activator is charged in a vessel made of porous material, disposed together with a material to be treated in a fluidized bed comprising a fluidizing agent and used for the treatment. When the layer-forming performance of the powder mixture comprising the layer-forming agent and the activator is degraded, the vessel is taken out of the furnace, the powder mixture comprising the layer-forming agent and the activator is replaced with a fresh one and the vessel is returned again into the fluidized bed. In this method, however, the powder mixture of the layer-forming agent and the activator has to be replaced every time when the layer-forming performance is lowered, which necessitates troublesome procedures, such as mixing of both of the powders, removal of the exhausted powder from the vessel, etc., and may often interrupt the coating operation.

SUMMARY OF THE INVENTION

It is accordingly an object of this invention to provide a method of forming a surface layer, such as of carbide or the like, on the surface of a material to be treated by using a fluidized bed, wherein the layer-forming performance of the treating agent is maintained or recovered if it is degraded thereby enabling economical and efficient continuous treatment, as well as a device used therefor.

The foregoing object can be attained in accordance with the present invention by a method of surface treatment, which comprises disposing in a fluidized bed furnace a treating agent comprising a powder of a refractory material, such as alumina, and a powder of a metal for forming a carbide, nitride, carbonitride or solid-solution or a powder of an alloy thereof, introducing a fluidizing gas, such as argon gas, into the fluidized bed furnace to fluidize the treating agent and form a bed, disposing the material to be treated in the fluidized bed, and introducing a predetermined amount of halide into the fluidized layer, thereby forming under heating a carbide, nitride, carbonitride, or solid-solution layer of the metal on the surface of the material to be treated.

The method of the surface treatment according to the present invention can be carried out by an apparatus also in accordance with the present invention, which comprises a furnace body for forming the surface layer in a fluidized bed of a treating agent comprising a powder of a refractory material, and a powder of a metal for forming a carbide, nitride, carbonitride or solid-solution or a powder of an alloy thereof, a heating furnace for heating the fluidized bed, a halide supply pipe in communicaition with the outside of the furnace body, and a halide gas jetting pipe disposed within the furnace body, i.e. within a fluidized bed below a material to be treated and above or below gas dispersion plate. This halide gas jetting pipe is connected to the halide supply pipe and has a plurality of apertures opened into the fluidized bed at its outer surface for jetting out a halide gas.

The above and other objects, features and advantages of the present invention will become more apparent from the following description when taken in conjunction with the accompanying drawings in which a preferred embodiment of the invention is shown by way of illustrative example.

BRIEF DESCRIPTION OF THE DRAWINGS

FIG. 1 is a schematic view of a treating device;

FIG. 2 is a plan view for the activated gas jetting pipe used in the device;

FIG. 3 is a cross sectional view taken along line III—III in FIG. 2;

FIG. 4 is a plan view illustrating another embodiment of the activator gas jetting pipe; and FIG. 5 is a cross sectional view taken along line V—V in FIG. 4.

DETAILED DESCRIPTION

The activator added in the fluidizing layer for maintaining the layer-forming performance may be one or more of ammonium halides, metal halides and alkali metal or alkaline earth metal halides which are sublimable or vaporizable at or below the treating temperature. The melting point of the activator may be higher or lower than the treating temperature. The activator is usually added successively in a solid state, such as powder. The activator is optionally added from the first to the fluidizing agent. The ammonium halide salt may include, for example, $NH_4Cl$, $NH_4Br$, $NH_4F$, $NH_4I$ and $NH_4BF_4$. The metal halide can include, for example, $TiF_4$, $VCl_3$, $VF_3$ and $FeCl_3$. The alkali metal or alkaline earth metal halide can include, for example, NaCl, KCl, $KBF_4$ $NaBF_4$. The amount of the activator added optionally is desirably from 0.05 to 20 weight % based on the total amount of the fluidizing agent and the layer-forming agent in order to obtain a surface layer of a sufficient thickness, and the activator of such an amount is added periodically at an interval of about one min. to 4 hours or not periodically. If the addition amount of the activator is less than 0.05%, it has to be added frequently and automatic addition means is required from an industrial point of view. On the other hand, if it exceeds 20%, the amount of the gas evolved is increased, tending to cause troubles, such as clogging in the piping. For decreasing the amount of waste gases thereby rendering the waste gas processing device smaller and simpler, it is desirable that the addition amount for each time is decreased and the activator in an amount about from 0.1 to 0.2% is added substantially continuously. Since the activator sublimes, vaporizes or is melted at the treating temperature, there is no particular restriction for the configuration of the activator. Usually, it is used in the form of pellet, cylinder or block to facilitate handling.

Figure 1:
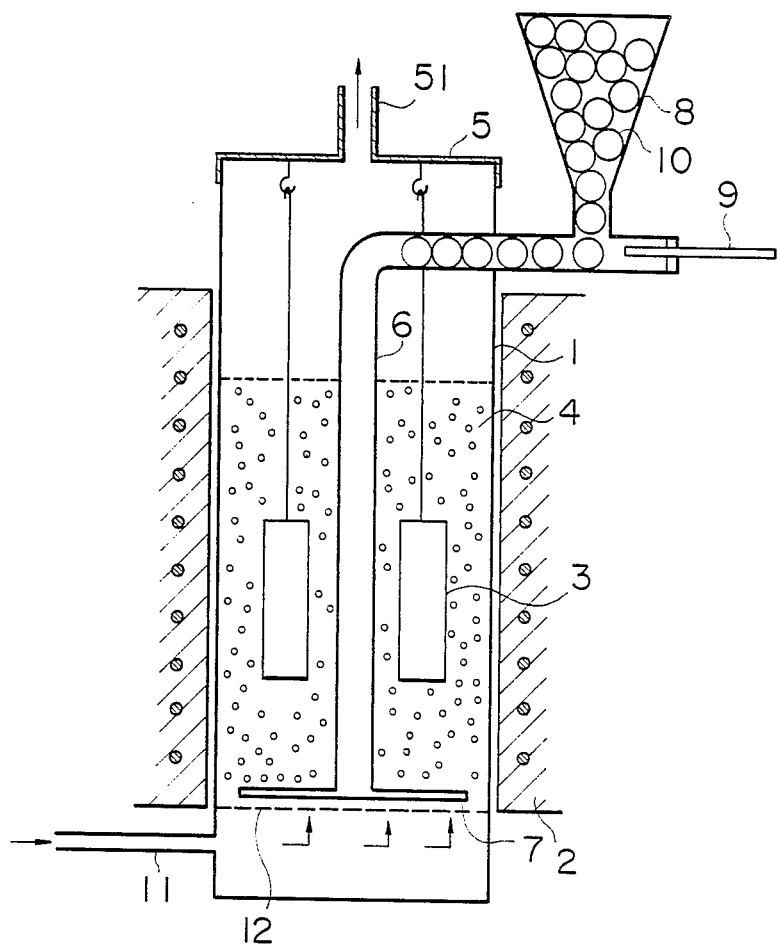
FIG. 1 to FIG. 5 are views for showing examples of this invention.
Figure 2:
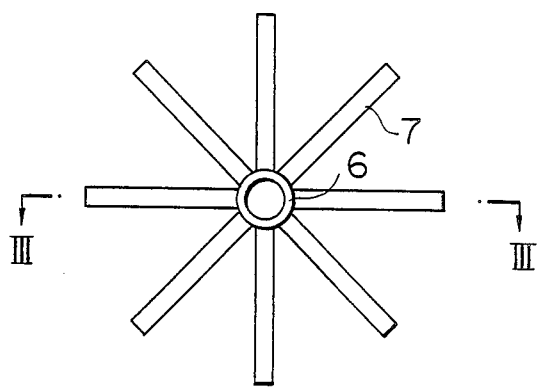
Figure 3:
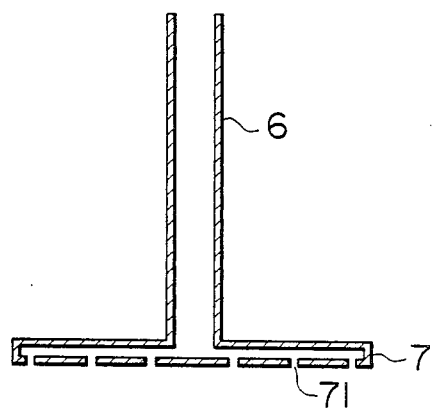
Figure 4:
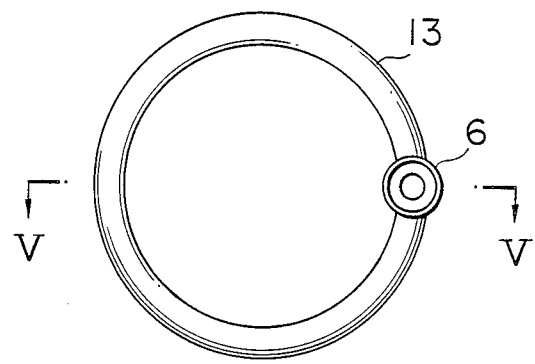
Figure 5:
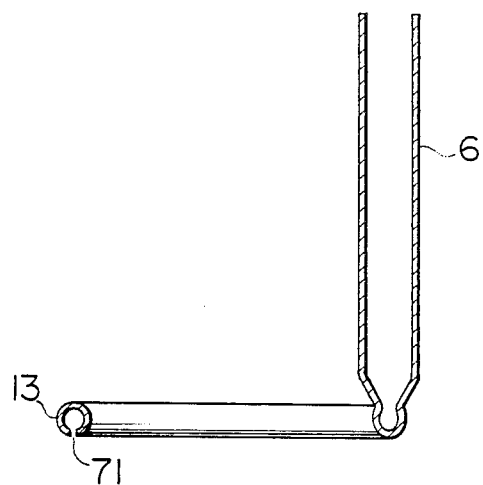

The activator is added by using an addition device, for example, as shown in FIG. 1. The device comprises, for example, as shown in FIGS. 2 and 3, an activator supply pipe 6 and a plurality of pipes 7 for discharging an activator gas. The device is disposed below material to be treated 3 in a fluidized bed 4. A plurality of gas jetting pipes 7 are arranged with a predetermined angle to each other for unifying the gas flow. When the ratio of "the total cross sectional area of the halide gas jetting pipe and halide supply pipe on a plane vertical to the flow of the fluidizing gas" to the vertical cross sectional area of the fluidized bed is too large, uniform fluidized state can no more be maintained. Then, practically, the ratio of not more than $\frac{1}{3}$ is practically preferred. Within the range, the diameter of the pipes 7 may be enlarged or the number of the pipes 7 may be increased The cross sectional shape for the pipe 6 and the pipe 7 may be circular, elliptic or square. It is preferred that the length for the pipe 7 be selected so as to be in a point-to-point symmetry with respect to the central position of the fluidized bed as much as possible. A plurality of small apertures are formed to the lower surface of the activator jetting pipe 7. The number, the diameter and the distribution of the apertures are so determined that the uniform flow of the gas is maintained. For instance, it may be desirable that the diameter and the number of the apertures at a portion near the activator supply pipe may be made smaller and decreased than those at a portion remote from the supply pipe in order to make the concentration of the activator gas uniform over the cross section of the fluidizing layer. One end of the activator supply pipe is extended out of the furnace, to which is provided an activator maintaining hopper 8. Pellets 10, etc., of the activator stored in the hopper 8 are pushed by a rod 9 and fall through the activator supply pipe 6. Upon reaching a portion heated to a temperature higher than the subliming or evaporating temperature, the activator sublimes or evaporates. The pipe is tightly closed so as to prevent the activator gas from releasing to the outside or the external atmosphere from intruding to the inside of the furnace. When the supplied activator reaches the high temperature region of the supply pipe, the activator gas is discharged by capacity expansion owing to subliming and vaporizing of the activator through small apertures 71 for jetting out the activator gas disposed to the lower surface of the activator gas jetting pipe 7. In this case, an inert gas or the like may also be supplied to the pipe 6 for facilitating the gas discharge. Further, the activator gas jetting pipe may be of a ring-like shape as shown in FIG. 4. In this case, the activator gas jetting pipe 7 may be disposed below a gas dispersion plate 12, and the activator supply pipe 6 in communication with the pipe 7 may be disposed to the outside of a furnace body 1. Furthermore, activator pellets or the likes pushed inward may be gasified before they are charged to the furnace main body by means of a heater attached to a portion of the activator supply pipe 6 situated at the outside of the furnace.

The refractory powder used as the fluidizing agent should be inert not reactive with the constituent metal of the material to be treated and any of those materials employed in usual heat treatment such as alumina ($Al_2O_3$), silicon oxide ($SiO_2$), titanium oxide ($TiO_2$), zirconia ($ZrO_2$), etc may be used. The refractory material may be used alone or as a mixture of two or more of them.

The metal for the carbide or nitride-forming element constituting the layer-forming agent involves those metals capable of easily bonding with carbon and/or nitrogen to form carbide, nitride or carbonitride and they can include typically titanium of group IVa element, vanadium, niobium and tantalum of group Va element, chromium of group VIa element and manganese of group VIIa element. Further, the metal for forming a solid solution may involve those readily forming a solid-solution with the matrix element and, typically titanium and chromium. In addition, alloys containing such elements can also be used as the layer-forming agent and they can include iron alloys, such as Fe-V, Fe-Nb, Fe-Cr, etc. For forming composite or two or more layers of carbide layers or nitride layers, two or more of metals of elements forming carbide, nitride, carbonitride or solid-solution or alloys thereof may be used in admixture.

The grain size both for the powder of the refractory material and the powder of metal of the element for forming carbide or the like is desirably selected within a range from 60 mesh to 350 mesh. If the grain size is coarser than 60 mesh, a great amount of the fluidizing gas is necessary for fluidizing the treating agent. If it is coarser than 60 mesh, the flow rate of the fluidizing gas becomes too high. As a result, the staying time of the halide gas evolved in the fluidized bed is too short thereby requiring a great amount of the activator for causing the halide gas to be present in the fluidized bed. Further, if the flow rate is too high, the halide gas has no sufficient time to react with the treated material and is discharged as it is failing to proceed the layer formation. On the contrary, a grain size of finer than 350 mesh is undesirable as well since the powder tends to be floated thereby rendering the handling difficult.

Depending on the condition, the powder of the treating agent may clog the inlet of the fluidizing gas to hinder the normal fluidization. Then, alumina or like other refractory material of coarser particles (grain size 5 ×20 mesh) may be disposed between the gas inlet and the powder of the treating agent. The amount of the layer-forming agent is preferably within the range of 1 to 50 weight % of the total amount of the treating agent. If the amount exceeds 50 weight %, the fluidizing agent tends to solidity and the fluidized state cannot be maintained. Referring to the material to be treated, there can be mentioned metal materials such as iron, nickel and cobalt containing carbon, cemented carbide and carbonaceous materials mainly composed of graphite in the case of forming a carbide or carbonitride layer. A carbide is formed to the surface of the treated material when a carbon contained in the treated material and the carbide-forming element in the treating agent are bonded to each other. It is desirable that at least 0.2% of carbon is contained in the treated material. If the carbon content is less than 0.2%, it may be difficult to form a carbide layer, or it may take a long time to form a carbide layer having a practically acceptable thickness. Further, if the treated material is a metal not containing carbon, it is possible to apply carburization to the material prior to the coating treatment by using other furnace or in the identical fluidized bed furnace, followed by the coating treatment according to the present invention. In the latter case, usual carburization treatment is at first applied by supplying nitrogen or argon gas incorporated with methanol or the like and, thereafter, the activator is added simultaneously with the supply of the argon gas.

In the case of forming the nitride layer, it is not always necessary that the treated material contains carbon and various metal materials such as iron, nickel and cobalt, cemented carbide and non-metal materials, such as oxides, for example, alumina, and sintered ceramics may be used. In this case, a nitrogen-containing gas is used as the fluidizing gas to form a nitride on the surface of the treated material by way of the bonding between the nitrogen-containing gas and the nitride-forming element in the treating agent. If carbon is contained in the treated material, a carbonitride layer is formed.

In either of the cases of forming the carbide layer or the nitride layer, it is possible to use an iron alloy material previously applied with nitriding treatment as the treated material. It is possible to form a nitrogen-containing carbide layer in the case of forming the carbide layer, whereas a nitride layer can be formed without using a nitrogen-containing gas as the fluidizing gas in the case of forming the nitride layer.

In the case of forming a solid-solution layer, metal material, such as iron and stainless steel not containing carbon, is used. As has been known already in many literatures, if no sufficient carbon or nitrogen is contained in the treated material and the supplied gas, those elements as a portion of the layer-forming agent may diffuse unto the treated material to form a solid-solution layer.

Referring to the fluidizing gas, an inert gas, such as argon, is used in the case of forming a carbide or solid-solution layer, whereas nitrogen or nitrogen-containing gas, such as ammonium or a gas mixture comprising them ogen-condaininggas, such as ammonium or a gas mixture comprising them together with argon is used in the case if forming a carbonitride or nitride layer. A small amount of hydrogen may be added to the fluidizing gas. The gas may be of an ordinary purity.

The fluidizing gas may be supplied at any desired flow rate in the fluidized bed furnace so long as it is within a range capable of attaining a sufficient and favorable fluidization. If the flow rate is too low, the fluidization becomes insufficient to render the temperature distribution unfavorable within the fluidized bed. While on the other hand, if the flow rate is too high, the amount of the gas consumption is increased and, further, it causes remarkable bubbling to make the procedures difficult.

When the fluidizing gas is charged into the fluidized bed furnace, the powder of the treating agent is blown upwardly in the furnace and kept from falling due to the pressure of the fluidizing gas continuously flowing to the inside, thereby forming a fluidized bed moving in the furnace in a floated state.

The fluidized bed furnace used in the present invention may be any of fluidized bed furnaces employed usually for the aim of drying, incineration, reduction, etc. For example, as shown in FIG. 1, the furnace may be so adapted that a fluidizing gas inlet 11 is opened to the lower portion of the furnace body 1 and the gas diffusion plate 12 is provided on the inlet side in the furnace. A lid 5 having a gas discharge port 51 is attached to the upper portion of the furnace. Alternatively, the furnace may have such a structure in which the furnace body is integrated with the lid and an openable door is disposed to the furnace body for mounting or removing the activator gas jetting pipes and treated material.

The heating step is applied by heating the fluidized bed as a heat medium. Specific means for the heating may be designed as shown in FIG. 1, in which the fluidized bed furnace 1 including the fluidized bed is inserted to the inside of an external heater 2, such as an electric furnace, so that the fluidized bed is heated from the outside, or in a system in which the fluidized bed is heated directly by a heater disposed within the fluidized bed furnace.

The heating temperature may be selected within a range from 700° to 1200° C. If it is lower than 700° C., the layer-forming velocity is remarkably reduced, whereas the matrix of the treated material may possibly be degraded if it exceeds 1200° C. and, therefore, both of the cases are not favorable. In the case of using an iron alloy material previously applied with the nitriding treatment as the treated material as described above, however, the carbide or nitride-forming element in the treating agent is diffused in the iron nitride formed through the nitriding treatment (iron carbonitride in the case of the iron alloy material containing carbon), the element take places substituting reaction with iron to form a nitride of the element (the carbonitride of the element in the case of the iron alloy material containing carbon). In this case, although the suraface layer may be formed at a relatively lower temperature, the heating temperature is desirably selected from 400° to 1200° C.

The treating time is selected within a range from 0.5 to 5 hours considering the composition of the treated material and the composition and the thickness of the layer to be formed. It generally requires a relatively shorter period of treating time at a higher treating temperature and, while on the other hand, a relatively longer period of treating time at a relatively lower treating temperature.

In the present invention, since the halide as the activator is supplied externally into the fluidized bed in the surface treatment step, it is no more necessary for the conventional procedures of mixing the powdery treating agent, recovery of the treating agent from the vessel and mixing of the activator, but the surface treatment can be applied continuously. Further, since the activator can be added little by little, the amount of the halogen gas exhausted from the fluidized bed is small thereby enabling to make the waste gas processing facility smaller and simpler. Furthermore, the treating agent can be used for a long period of time with no requirement of exchange and the amount of valuable carbide-forming element metal such as titanium and vanadium, can be decreased.

In addition, in a case where automatic insertion and recovery device for the treated material is disposed as conducted in usual heat treatment using the fluidized bed, continuous treatment is possible.

This invention will now be described with reference to Examples thereof.

Example 1

The carbide coating treatment according to the present invention was carried out by using the fluidized bed furnace shown in FIG. 1. The fluidized bed furnace comprised a furnace body 1 having a gas supply channel 11 for fluidizing argon gas opened at its bottom, and a gas diffusion plate 12 disposed just above the opening for bisecting the inside of the furnace. A detachable lid 5 was capped to the top of the furnace body 1 and a gas discharge channel 51 connected to a scrubber for trapping waste gases was opened to a portion of the lid 5.

A heater 2 was disposed around the outer circumference of the furnace body 1. The furnace body 1 comprised cylindrical shell made of heat resistant steel and having a diameter of 60 mm and a height of 800 mm.

1 Kg of the powdery treating agent was placed on the gas diffusion plate 12 in the fluidized bed furnace. The treating agent contained 50% of alumina powder (80–100 mesh) and 40% of ferrovanadium powder (containing 70% vanadium, 100–200 mesh). Then, an argon gas was supplied as a fludizing gas at a pressure of 1.5 kg/cm$^2$ and a flow rate of 140 cm/min from the gas supply channel 11 to the inside of the furnace body 1. Then, the powdery treating agent was fluidized to form a fluidized bed 4. In the lower portion of the fluidized bed, eight activator gas jetting pipes 7 connected with the activator supply pipe 6 as shown in FIGS. 2 and 3 were disposed above the gas diffusion plate 12. The inner diameter of the activator supply pipe 6 was 9 mm and that of the activator gas jetting pipe 7 was 3 mm. Further, each of the gas jetting pipes 7 had small gas jetting apertures 71 each of 0.5 mm diameter formed at three positions at the lower surface of the pipe 7.

Then, two materials 3 to be treated (alloy tool steel SKD 11, 7 mm diameter and 50 mm height) were suspended substantially at the central portions of the fluidized bed each by a hanger attached to the inner surface of the lid. Then, after capping the lid 5 to the top of the furnace body 1 and tightly closing, the fluidizing bed was heated to 1000° C.

Then, 0.4 g of ammonium chloride powder as the activator was molded into a cylindrical form (7 mm diameter and 7 mm height) by way of a hydraulic press and a number of the molded compressed pieces of ammonium chloride were supplied from above the activate maintaining hopper 8 and, after tightly closing the upper end, and pushed by a rod 9 so that two of the compressed pieces are fallen into the activator supply pipe. The amount of the two ammonium chloride compressed pieces was corresponded to 0.08% of the total amount of the treating agent. One hour after the starting of the operation, one piece of the ammonium chloride compressed pieces was further supplied. After conductiong two hours' treatment, the treated material was taken out from the furnace by detaching the lid and then oil-cooled.

Then, the treated material of the same composition and configuration was placed by two at the central portion of fluidized bed in the same procedures as described above and the treatment was conducted subsequently in the same procedures as described above while successively supplying the compressed pieces of ammonium chloride. The above-mentioned procedures were repeated for four times. Upon visually observing the surface of the thus obtained treated material, neither the adherence of the treating agent nor the unevenness in color was recognized and the material surface was smooth. Then, upon microscopic observation for the cross section, it was recognized that a uniform coating layer of 5 to 6 $\mu$m thickness was formed. Then, it was confirmed by X-ray diffraction that the layer was made of vanadium carbide (VC). When the hardness of the layer was measured it showed about Hv 3000 hardness.

As has been described above, a vanadium carbide layer of a sufficient thickness could be coated by merely adding only about 0.1% of the activator optionally.

Example 2

A carbide coating treatment was carried out by using a fluidized bed furnace using 1 kg weight of the treating agent comprising the composition of 60% of alumina powder (80–100 mesh) and 40% of ferrotitanium powder (100–200 mesh) in which the activator gas jetting ring 13 as shown in FIG. 4 was disposed instead of the activator gas jetting pipe 7 of the fludized bed furnace used in Example 1. The activator gas jetting ring 13 was in communication vertically with the activator supply pipe 6. The top end of the pipe 6 was extended out of the furnace and provided with the activator maintaining hopper 8, etc. in the same manner as in Example 1. The activator supply pipe had an inner diameter of 10 mm and the diameter was reduced to 5 mm in the portion connected with the ring. The activator gas jetting ring had the outer diameter of 55 mm and the inner diameter of 5 mm for the ring constituting pipe. Apertures each of 0.5 mm diameter were formed in a equivalent interval at 15 positions to the lower surface of the ring. Then, the treated material (carbon steel SK4, 7 mm diameter and 50 mm height) was suspended to the central portion of the fluidized bed by way of a hanger attached to the inner surface of the lid 5. Then, after capping the top of the furnace body with the lid 5 and tightly closing, the fluidized bed was heated to 1000° C. Then, 0.9 g of ammonium chloride powder (80–100 mesh) as the activator was molded into a cylindrical form of 9 mm diameter and 9 mm height by means of a hydraulic press. The ammonium chloride pellet was injected from above the activator maintaining hopper 8 and, after the tight closure, pushed by a rod 9 to fall to the inside of the activator supply pipe. The amount of one ammonium chloride compressed piece was corresponded to 0.09% of the total amount of the treating agent. One hour after the starting of the operation a further ammonium chloride pellet was supplied. After conducting heat treatment for 2 hours, the treated material was taken out of the furnace and oil-cooled. Then, the treated material of the identical composition and shape as described above was treated by using ammonium chloride of an identical amount supplied to the inside of the activator supply pipe as described above and applied with treatment for 2 hours. The procedures were repeated for five times. It was found that a smooth coating layer of 9 to 10 $\mu$ thickness was formed to the surface of each treated material thus obtained. Upon analyzing the layer by way of X-ray diffractiometry, it was confirmed that the layer was titanium carbide (TiC) layer. When the hardness of the layer was measured, it showed about 3500 Hv hardness.

Example 3

A carbide coating and solid-solution layer-forming treatment were carried out by using a fluidized bed furnace in Example 1, using 1 kg weight of the treating agent comprising the composition of 60% of alumina powder 80-100 mesh) and 20% of chromium powder (100-200 mesh).

At first, treated materials (carbon steel SK4 and industrial pure iron, each 7 mm diameter and 50 mm height) were suspended at the central portion of the fluidized bed by way of hangers attached to the inner surface of the lid. Then, after capping the top of the furnace body with the lid and, after tight closure, the fluidized bed was heated to 1000° C. Then, 0.7 g of ammonium bromide powder (80-100 mesh) as the activator was molded into a cylindrical form (7 mm diameter and 7 mm height) by means of a hydraulic press. The ammonium bromide pellet was injected from above the activator maintaining hopper 8 and, after tightly closing the upper of the hopper, pushed by a rod 9 to fall one pellet to the inside of the activator supply pipe. The amount of one ammonium chloride pellet was corresponded to 0.07% of the total amount of the treating agent. 0.05 and one hour after the starting of the operation, a further one ammonium bromide pellet was supplied respectively. After conducting heat treatment for 2 hours, the treated materials were taken out of the furnace and oil-cooled. Then, treated materials of the identical composition and shape as described above were treated by using ammonium bromide of the same amount as above was supplied to the inside of the activator supply pipe as described above and the treatment was applied for 2 hours. The procedures were repeated for five times. It was found that the surface of each of the treated materials thus obtained was extremely smooth with no adherence of powder. Further, a coating layer of 8-9 $\mu$ thickness was formed to the surface of SK4. Upon analyzing the layer by way of X-ray diffraction, it was confirmed that the layer was chromium carbide ($Cr_7C_3 + Cr_{23}C_6$) layer. When the hardness of the layer was measured, it showed about 2000 Hv hardness. Further, in the case of industrial pure iron, a chromium-solid solution layer of 24-25 $\mu$m thickness was formed. When the amount of chromium in the layer cross section was analyzed by X-ray microanalyzer, it was confirmed to be 60% at maximum.

What is claimed is:

1. A method of forming a surface layer on a material to be treated, which comprises:

disposing in a fluidized bed furnace a treating agent comprising a powder of a refractory material, and a powder of a metal for forming a carbide, nitride, carbonitride or solid-solution or a powder of an alloy thereof, introducing a fluidizing gas into said fluidized bed furnace to fluidize said treating agent and form a fluidized bed, disposing said material to be treated in said fluidized bed, introducing, as activator means, solid halide through halide supply pipe means for conducting activator from outside of the furnace, and gasifying said solid halide by means of halide gasification means disposed within said fluidized bed furnace, said halide gasification means being connected to said halide supply pipe means and having a plurality of apertures which open into said fluidized bed, thereby forming under heating a carbide, nitride, carbonitride, or solid-solution layer of said metal on the surface of said material to be treated.

2. A method according to claim 1, wherein said halide comprises at least one member selected from the group consisting of ammonium halides, metal halides, and alkali metal or alkaline earth metal halides, the amount of said halide being 0.05 to 20 weight % based on said treating agent.

3. A method according to claim 1 wherein the amount of said metal powder or said alloy powder is 1 to 50 weight % based on said treating agent.

4. A method according to claim 1 wherein said fluidizing gas is a nitrogen gas, a nitrogen-containing gas or a mixture of said nitrogen or nitrogen-containing gas and argon, thereby forming the nitride or carbonitride layer on the surface of said material to be treated.

5. A method according to claim 1 wherein said fluidizing gas is an inert gas, thereby forming the carbide or solid-solution layer on the surface of said material to be treated.

6. A method according to claim 1 wherein said heating is carried out at a temperature of 400° C. to 1200° C.

7. A method according to claim 1 wherein
    said treating agent comprises said refractory material powder and said metal or alloy powder for forming a carbide or a carbonitride, and
    said material to be treated is one of a metal material containing carbon, cemented carbide, and a carbonaceous material mainly composed of graphite,
    thereby forming the carbide or carbonitride layer on the surface of said material to be treated.

8. A method according to claim 7, wherein said material to be treated is one of iron, nickel and cobalt containing carbon.

9. A method according to claim 1, wherein said treating agent comprises said refractory material powder and said metal or alloy powder for forming a nitride, and
    said material to be treated is one of a metal material or a non-metal material,
    thereby forming the nitride layer on the surface of said material to be treated.

10. A method according to claim 9, wherein said material to be treated is one of iron, nickel, cobalt and sintered ceramics.

11. A method according to claim 1, wherein
said treating agent comprises said refractory material powder and said metal or alloy powder for forming a solid-solution, and
said material to be treated is a metal material not containing carbon,
thereby forming the solid-solution layer on the surface of said material to be treated.

12. A method according to claim 11, wherein said material to be treated is one of iron and stainless steel not containing carbon.

13. A method according to claim 1, wherein
said treating agent comprises said refractory material powder and said metal or alloy powder for forming a carbide, a nitride or a carbonitride, and
said material to be treated is a metal material subjected to a nitriding treatment,
thereby forming the carbide, nitride or carbonitride layer on the surface of said material to be treated.

14. Apparatus for forming a surface layer on material to be treated, comprising:

a fluidized bed furnace for forming said surface layer in a fluidized bed of treating agent comprising powder of a refractory material and powder of a metal for forming a carbide, nitride, carbonitride or solid-solution or powder of an alloy thereof,
means for introducing a fluidizing gas into said fluidized bed furnace to fluidize said treating agent and form the fluidized bed,
means for disposing the material to be treated in said fluidized bed,
halide supply pipe means for introducing solid halide from outside of said furnace,
halide gasification means for gasifying said halide, dispose within said fluidized bed furnace, said halide gasification means being connected to said halide supply pipe means and having a plurality of apertures which open into said fluidized bed, and
heating means for heating said fluidized bed.

15. An apparatus according to claim 14, wherein the ratio of the total cross sectional area of said halide gasification means and halide supply pipe means on a plane vertical to the flow of the fluidizing gas is not more than $\frac{1}{3}$ of the vertical cross sectional area of the fluidized bed.

* * * * *